(12) United States Patent
Tanaka et al.

(10) Patent No.: US 11,605,647 B2
(45) Date of Patent: Mar. 14, 2023

(54) FERROELECTRIC-TYPE SEMICONDUCTOR MEMORY DEVICE WITH HOLE TRANSFER-TYPE LAYER

(71) Applicant: KIOXIA CORPORATION, Tokyo (JP)

(72) Inventors: Yusuke Tanaka, Kawasaki Kanagawa (JP); Masumi Saitoh, Yokkaichi Mie (JP); Kensuke Ota, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 80 days.

(21) Appl. No.: 17/189,197

(22) Filed: Mar. 1, 2021

(65) Prior Publication Data

US 2022/0059570 A1    Feb. 24, 2022

(30) Foreign Application Priority Data

Aug. 21, 2020    (JP) .............................. JP2020-140440

(51) Int. Cl.

| | |
|---|---|
| *H01L 27/11597* | (2017.01) |
| *H01L 29/51* | (2006.01) |
| *H01L 29/24* | (2006.01) |
| *H01L 27/1159* | (2017.01) |
| *H01L 29/66* | (2006.01) |
| *H01L 29/786* | (2006.01) |

(52) U.S. Cl.
CPC .... *H01L 27/11597* (2013.01); *H01L 27/1159* (2013.01); *H01L 29/24* (2013.01); *H01L 29/516* (2013.01); *H01L 29/6684* (2013.01); *H01L 29/66787* (2013.01); *H01L 29/7869* (2013.01); *H01L 29/78642* (2013.01); *H01L 29/78648* (2013.01); *H01L 29/78696* (2013.01)

(58) Field of Classification Search
CPC ........... H01L 27/11585; H01L 27/1159; H01L 27/11597; H01L 29/24; H01L 29/516; H01L 29/66666; H01L 29/66787; H01L 29/6684; H01L 29/78642; H01L 29/78648; H01L 29/7869; H01L 29/78696
See application file for complete search history.

(56) References Cited

U.S. PATENT DOCUMENTS 9,780,170 B2 * 10/2017 Ota .................. G11C 5/025
10,580,783 B2 * 3/2020 Cui .................. H01L 27/11573
(Continued)

FOREIGN PATENT DOCUMENTS

| JP | 6400536 B2 | 10/2018 |
|---|---|---|
| JP | 2019160374 A | 9/2019 |

(Continued)

*Primary Examiner* — Matthew E Warren
(74) *Attorney, Agent, or Firm* — Kim & Stewart LLP

(57) ABSTRACT

According to one embodiment, a semiconductor memory device includes a ferroelectric layer and a first semiconductor layer. The first semiconductor layer is electrically connected to a first electrode and a second electrode and includes an n-type oxide semiconductor. A third electrode is opposite the first semiconductor layer. The ferroelectric layer is between the third electrode and the first semiconductor layer. A second semiconductor layer includes at least one of a Group IV semiconductor material or a p-type oxide semiconductor material. The first semiconductor layer is between the ferroelectric layer and the second semiconductor layer.

19 Claims, 11 Drawing Sheets

(56) References Cited

U.S. PATENT DOCUMENTS

| | | | |
|---|---|---|---|
| 10,636,468 B2 | 4/2020 | Higashi et al. | |
| 10,868,037 B2 * | 12/2020 | Arai | H01L 27/11573 |
| 2011/0180793 A1 * | 7/2011 | Taniguchi | H01L 29/66969 |
| | | | 257/E21.409 |
| 2015/0207067 A1 | 7/2015 | Doolittle et al. | |
| 2019/0214058 A1 | 7/2019 | Koyama et al. | |
| 2020/0144293 A1 | 5/2020 | Majhi et al. | |
| 2020/0176457 A1 | 6/2020 | Sharma et al. | |

FOREIGN PATENT DOCUMENTS

| | | |
|---|---|---|
| WO | 2018236353 A1 | 12/2018 |
| WO | 2019054993 A1 | 3/2019 |
| WO | 2019066948 A1 | 4/2019 |

\* cited by examiner 22　104　103　102

22　104　103　102

FERROELECTRIC-TYPE SEMICONDUCTOR MEMORY DEVICE WITH HOLE TRANSFER-TYPE LAYER

CROSS-REFERENCE TO RELATED APPLICATION(S)

This application is based upon and claims the benefit of priority from Japanese Patent Application No. 2020-140440, filed Aug. 21, 2020, the entire contents of which are incorporated herein by reference.

FIELD

Embodiments described herein relate generally to a semiconductor memory device.

BACKGROUND

Semiconductor memory devices which use the spontaneous polarization of a ferroelectric film are attracting attention. In such a semiconductor memory device, each memory cell includes a ferroelectric film, and, by applying a voltage to the ferroelectric film, the direction or polarizability of spontaneous polarization, data can be caused to be stored in the memory cell.

DETAILED DESCRIPTION

Embodiments provide a highly reliable semiconductor memory device.

In general, according to one embodiment, a semiconductor memory device includes a ferroelectric layer and a first semiconductor layer. The first semiconductor layer is electrically connected to a first electrode and a second electrode and includes an n-type oxide semiconductor. A third electrode is opposite the first semiconductor layer. The ferroelectric layer is between the third electrode and the first semiconductor layer. A second semiconductor layer includes at least one of a Group IV semiconductor material or a p-type oxide semiconductor material. The first semiconductor layer is between the ferroelectric layer and the second semiconductor layer.

Hereinafter, certain example embodiments of the present disclosure will be described with reference to the drawings. To facilitate understanding of the description, the repeated elements or aspects in the respective drawings are assigned the same reference symbols, and any generally description of such repeated elements or aspects will be omitted from subsequent description of figures and/or embodiments incorporating the previously described elements or aspects. The drawings are merely schematic, and depicted dimensions, such as thicknesses and widths of layers, and the ratios between depicted dimensions of layers, elements, and the like are not necessarily the same as those in actual or real devices.

Figure 1:
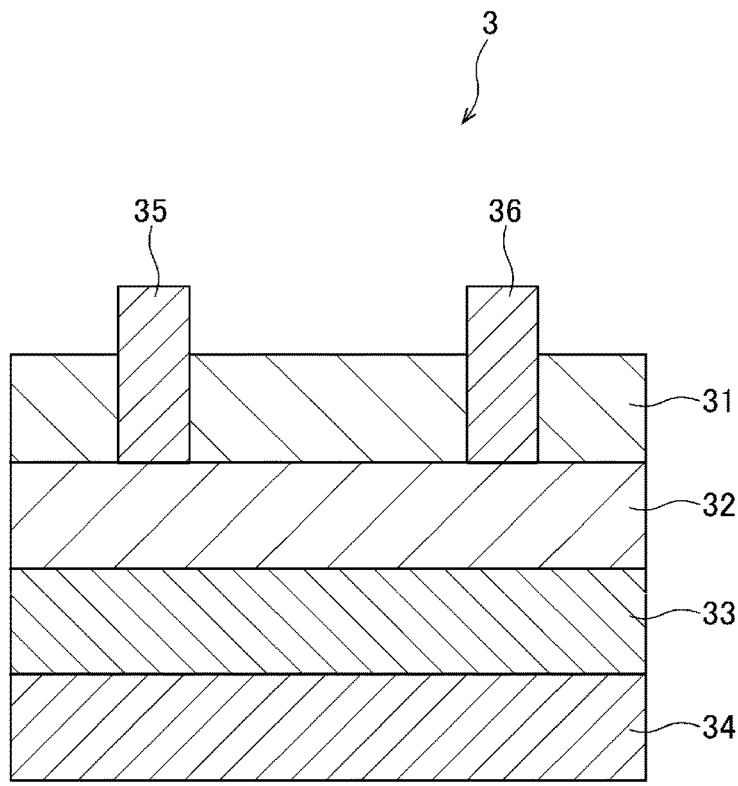
FIG. 1 is a cross-sectional view illustrating aspects of a semiconductor memory device according to a first embodiment.

A first embodiment is described with reference to FIG. 1. The first embodiment is merely an example, and does not limit the present disclosure. FIG. 1 is a cross-sectional view illustrating a structural example of a semiconductor memory device in the first embodiment.

As illustrated in FIG. 1, a semiconductor memory device 3 includes a hole transfer layer 31, an n-type oxide semiconductor layer 32, a ferroelectric layer 33, and a gate electrode layer 34, which are stacked on each other. The semiconductor memory device 3 further includes a source electrode 35 and a drain electrode 36, which reach the n-type oxide semiconductor layer 32 by penetrating through the hole transfer layer 31. Accordingly, the source electrode 35 and the drain electrode 36 are electrically connected to the n-type oxide semiconductor layer 32 and the hole transfer layer 31.

The n-type oxide semiconductor layer 32 serves as a channel region. The n-type oxide semiconductor layer 32 may comprise, for example, an oxide of at least one of indium (In), gallium (Ga), aluminum (Al), zinc (Zn), and titanium (Ti). For example, the n-type oxide semiconductor layer 32 is indium gallium zinc oxide (InGaZnO) ("IGZO"), which is an oxide containing indium (In), gallium (Ga), and zinc (Zn), indium aluminum zinc oxide (InAlZnO) ("IAZO"), which is an oxide containing indium (In), aluminum (Al), and zinc (Zn), or a titanium oxide (for example, titanium dioxide ($TiO_2$)). The thickness of the n-type oxide semiconductor layer 32 is between 5 nanometers (nm) and 20 nm, and may be set to about 10 nm, for example. When polysilicon is used as the channel region, an interfacial layer having a low dielectric constant may form between the ferroelectric layer and the semiconductor layer. The influence of the interfacial layer makes it difficult to satisfy both of a low-voltage operation preference and a high reliability operation preference, however, using the n-type oxide semiconductor layer 32 of the present embodiment as a channel region prevents or reduces the formation of an interfacial layer having a low dielectric constant.

The ferroelectric layer 33 may include, as a ferroelectric material, an oxide of hafnium (Hf). For example, the ferroelectric layer 33 may include, for example, a hafnium oxide in orthorhombic crystal form. The hafnium oxide included in a ferroelectric film may be one composed mainly of an orthorhombic crystal. More specifically, the hafnium oxide included as a ferroelectric material may be composed mainly of a third orthorhombic crystal (orthorhombic III, space group $Pbc2_1$, space group number 29). The proportion of crystals in orthorhombic crystal form may be the greatest among the crystals of oxide hafnium included in the ferroelectric film. Furthermore, an orthorhombic crystal can also be called a "rhombic crystal". The oxide may further contain at least one of zirconium (Zr), aluminum (Al), and silicon (Si) in addition to hafnium (Hf). For example, hafnium zirconium oxide (HfZrO), hafnium aluminum oxide (HfAlO), or hafnium silicon oxide (HfSiO) may be used.

The hole transfer layer 31 comprises at least one of a Group IV semiconductor material or a p-type oxide semiconductor material. The Group IV semiconductor material to be used may comprise, for example, least one of silicon (Si), germanium (Ge), or tin (Sn). The Group IV semiconductor material may be in amorphous form, polycrystalline form, or single-crystal form. Such Group IV semiconductor material may initially be a p-type doped semiconductor or an undoped semiconductor. A p-type oxide semiconductor material incorporated into the hole transfer layer 31 can be, for example, a copper oxide (for example, $Cu_2O$), a tin oxide (for example, SnO), and a nickel oxide (for example, NiO). In the present example, the Group IV semiconductor material is an amorphous silicon film, but, in other examples, a polycrystalline silicon film or a single-crystal silicon film may be used.

The semiconductor memory device 3 utilizes a phenomenon in which the polarized state of the ferroelectric layer 33 changes. Inverting the polarity of the ferroelectric layer 33 is used to perform a write or erasing operation. The write operation includes applying a voltage in such a way as to bring about a polarization in which positive electric charge appears on a side of the ferroelectric layer 33 facing the n-type oxide semiconductor layer 32. The erasing operation includes applying a voltage in such a way as to bring about a polarization in which negative electric charge appears on a side of the ferroelectric layer 33 facing the n-type oxide semiconductor layer 32. Changing the polarized state of the ferroelectric layer 33 in this way enables changing a threshold voltage for a transistor and thus permits storing of information by setting or not such threshold voltage changes. The write operation causes the threshold voltage to decrease from an initial state, and the erasing operation causes the threshold voltage to increase. Accordingly, when, during a read operation, a predetermined voltage is applied to the gate electrode layer 34, a current flows through the n-type oxide semiconductor layer 32 to cause the n-type oxide semiconductor layer 32 to function as a channel, so that the semiconductor memory device 3 enters into an ON state if presently in the written state, and, on the other hand, no current flows through the n-type oxide semiconductor layer 32 if the semiconductor memory device 3 is presently in the erased state, so that the semiconductor memory device 3 is an OFF state. This enables reading out stored information.

In some examples, the above-mentioned write operation and erasing operation may be switched around, and therefore, a voltage may be applied in the write operation in such a way as to bring about a polarization in which negative electric charge appears on a side of the ferroelectric layer 33 facing the n-type oxide semiconductor layer 32 and for the erasing operation, a voltage may be applied in such a way as to bring about a polarization in which positive electric charge appears on a side of the ferroelectric layer 33 facing the n-type oxide semiconductor layer 32. The following description is made with the former case assumed.

When, IGZO is used as a channel of the n-type oxide semiconductor, although it is possible to perform a write operation, it is more difficult to perform an erasing operation since holes are unlikely to be generated. In the present embodiment, in an erasing operation, retaining holes occurring in the hole transfer layer 31 is used to apply a voltage in such a way as to bring about a polarization in which negative electric charge appears on a side of the ferroelectric layer 33 facing the n-type oxide semiconductor layer 32. This enables performing an erasing operation with a simpler structure without requiring a more complicated structure such as a back gate electrode.

Figure 2:
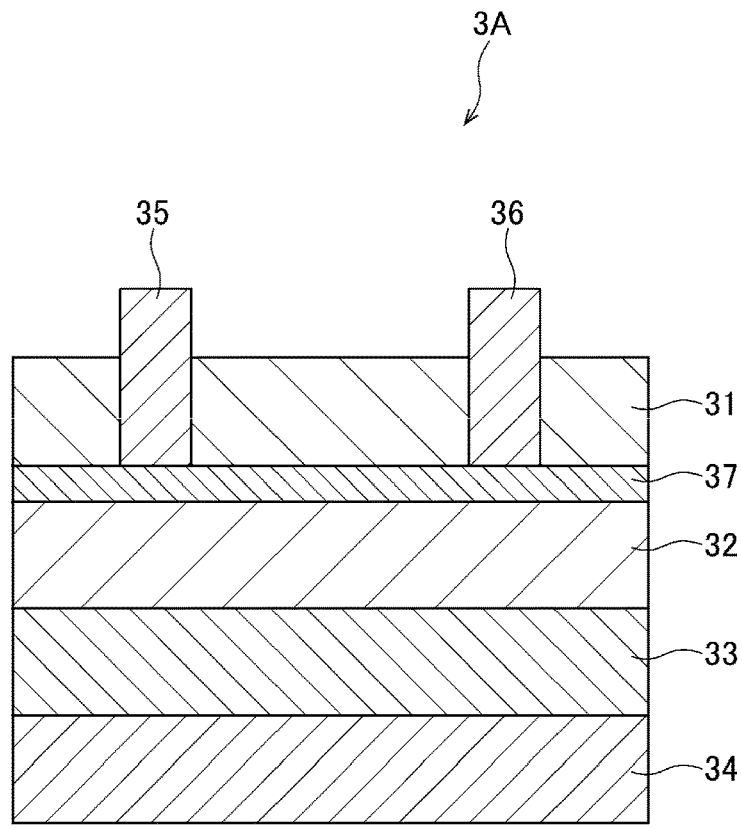
FIG. 2 is a cross-sectional view illustrating an interfacial layer or an electronic barrier added to a semiconductor memory device.

FIG. 2 is a cross-sectional view illustrating a structural example in which an intermediate layer is additionally provided in the semiconductor memory device illustrated in FIG. 1. As illustrated in FIG. 2, a semiconductor memory device 3A includes a hole transfer layer 31, an intermediate layer 37, an n-type oxide semiconductor layer 32, a ferroelectric layer 33, and a gate electrode layer 34, which are stacked in layers.

The intermediate layer 37 is an interfacial layer and includes a material having a larger band gap than that of the n-type oxide semiconductor layer 32, such as a silicon oxide (for example, $SiO_2$) or an indium gallium silicon oxide (InGaSiO) ("IGSO"), which is an oxide containing indium (In), gallium (Ga), and silicon (Si), so that the intermediate layer 37 acts as a hole barrier layer and is thus able to provide a hole retention force for the hole transfer layer 31 and retain an electrical potential used for changing the polarized state of the ferroelectric layer 33.

The intermediate layer 37 is configured to use the above-mentioned larger band gap material to act as an electronic barrier layer and is thus able to prevent or reduce any leakage occurring between the hole transfer layer 31 and the n-type oxide semiconductor layer 32 during a read.

A second embodiment is described with reference to FIG. 3. In the second embodiment, a NAND-type flash memory, which is a semiconductor memory device that stores data in a nonvolatile manner, is described as an example. The second embodiment is merely an example, and is in no way intended to limit the present disclosure. While a semiconductor memory device of this particular example has a structure in which each memory string extends in a straight line in a direction intersecting with a substrate surface, in other examples a similar structure may also be applied to a structure having a U-like shape in which each memory string is folded back on itself toward the opposite side.

Figure 3:
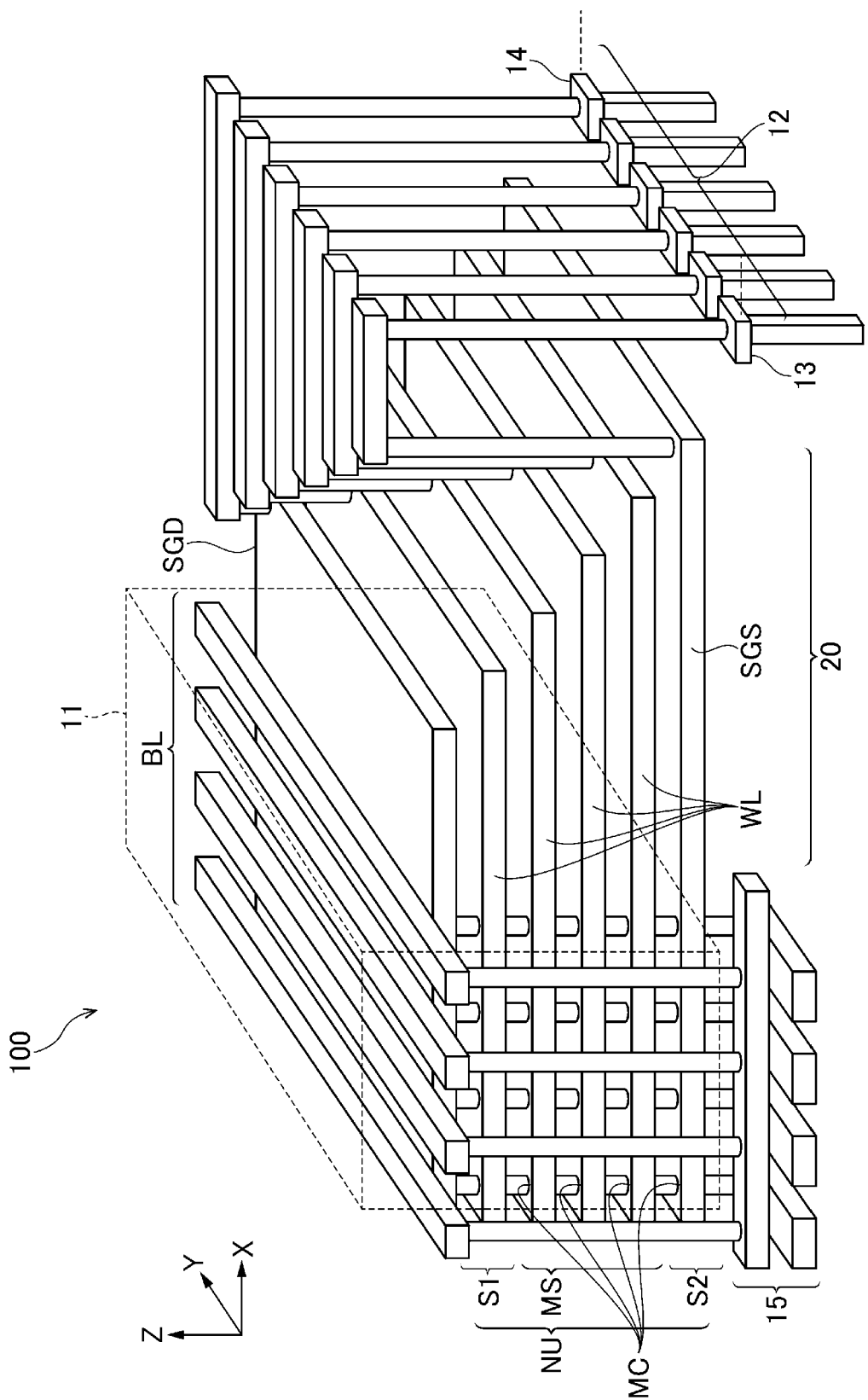
FIG. 3 is a perspective view of a semiconductor memory device in a second embodiment.

FIG. 3 is a perspective view illustrating a structural example of a semiconductor memory device 100 in the second embodiment. As illustrated in FIG. 3, the semiconductor memory device 100 includes a memory cell array 11, word line drive circuits 12, a source-side select gate line drive circuit 13, a drain-side select gate line drive circuit 14, sense amplifiers 15, word lines WL, a source-side select gate line SGS, a drain-side select gate line SGD, bit lines BL, and a word line wiring portion 20.

The memory cell array 11 includes memory strings MS, drain-side select transistors S1, and source-side select transistors S2. The memory string MS is configured with a plurality of memory cells MC (which may also be referred to as memory transistors) interconnected in series. The drain-side select transistor S1 and the source-side select transistor S2 are connected to the respective two ends of the memory string MS. Furthermore, the memory string MS along with the drain-side select transistor S1 and the source-side select transistor S2 connected to the respective ends of the memory string MS, are also referred to collectively as a "NAND cell unit NU".

Each memory cell MC has a structure in which the side surface of a columnar semiconductor film serving as a channel has a control gate electrode (which in this context is also a word line) provided thereon via a ferroelectric layer serving as a memory layer. Both the drain-side select transistor S1 and the source-side select transistor S2 have a structure in which the side surface of a columnar semiconductor film has a select gate electrode (which in this context is also a select gate line) provided thereon via a ferroelectric film. For ease of illustration, FIG. 3 illustrates a case where each memory string MS has four memory cells MC, but the number of memory cells MC in each memory string MS is not limited to this.

Each word line WL is connected in common to memory cells MC arranged side by side in an X-direction and Y-direction as illustrated in FIG. 3. The source-side select gate line SGS is connected in common to source-side select transistors S2 arranged side by side in the X-direction and Y-direction. The drain-side select gate line SGD is connected in common to drain-side select transistors S1 arranged side by side in the X-direction and Y-direction. In the following description, the source-side select gate line SGS and the drain-side select gate line SGD can both be referred to simply as a "select gate line" or "select gate lines". Similarly, the source-side select transistor S2 and the drain-side select transistor S1 are sometimes also both referred to simply as a "select transistor" or "select transistors."

Out of the memory cells MC in one memory string MS, one or more memory cells MC provided close to either the source-side select gate line SGS or the drain-side select gate line SGD may, in some cases, be a dummy memory cell ("dummy cell"), which is not actually used for storing of data. An example in which one dummy cell at each of the two ends of the memory string MS is described below, but the present embodiment is not intended to be limited to this, and two or more dummy cells at one or both ends may be used. Moreover, in some examples the dummy cell(s) may be omitted entirely.

The bit lines BL are arranged to extend with a longitudinal direction thereof set parallel to the Y-direction, which is perpendicular to the X-direction, and are arrayed at a predetermined pitch (spacing interval) along the X-direction. The bit lines BL are connected to a plurality of memory strings MS via the drain-side select transistors S1. A source line SL is not separately illustrated in FIG. 3, but is arranged with a longitudinal direction thereof set parallel to, for example, the Y-direction and connected to the memory strings MS via the source-side select transistors S2.

The word line drive circuit 12 is a circuit which controls a voltage to be applied to the word line WL. The source-side select gate line drive circuit 13 is a circuit which controls a voltage to be applied to the source-side select gate line SGS. The drain-side select gate line drive circuit 14 is a circuit which controls a voltage to be applied to the drain-side select gate line SGD. The sense amplifier 15 is a circuit which amplifies a signal (i.e., a voltage) readout to a bit line BL from the selected memory cell MC. These circuits operate to apply a voltage to a select gate line or a word line, thus controlling a write operation, a read operation, and an erasing operation performed on the memory cells MC.

The wiring portion 20 is used to connect the word lines WL, the source-side select gate line SGS, and the drain-side select gate line SGD to contacts. The word lines WL, the source-side select gate line SGS, and the drain-side select gate line SGD have a structure shaped in a staircase pattern (stair step pattern) to permit connections to the respective contacts at the respective upper portions thereof.

Figure 4:
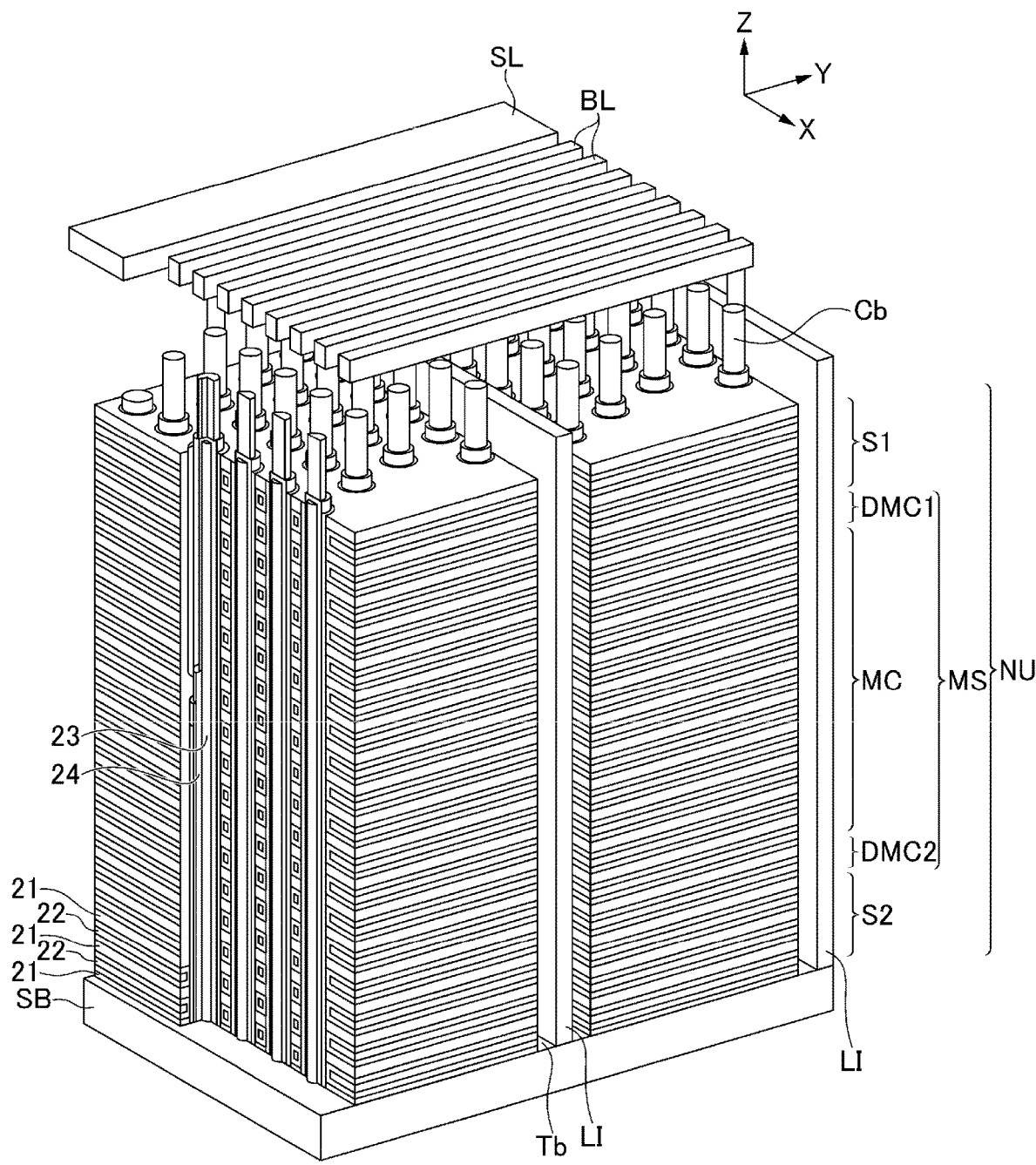
FIG. 4 is a perspective view schematically illustrating a structure of a part of a memory cell array in a semiconductor memory device.
Figure 5:
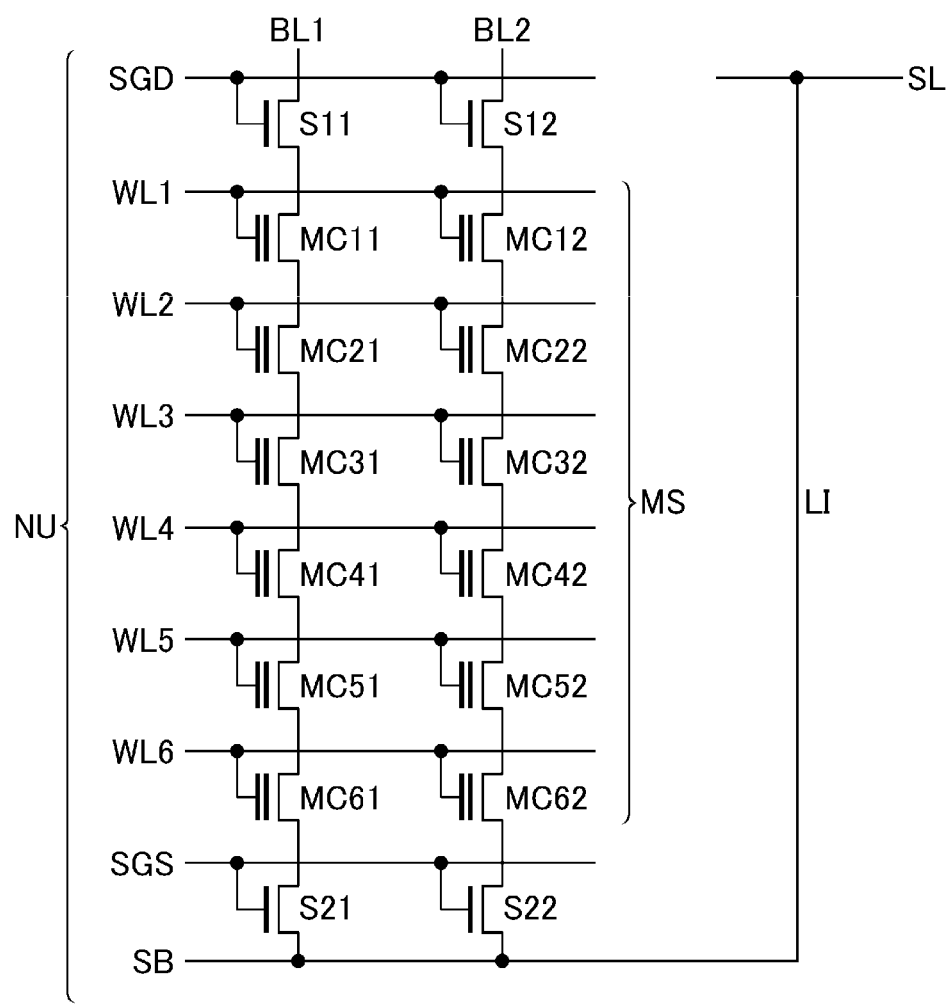
FIG. 5 is an equivalent circuit diagram of one NAND cell unit.

Next, a structure of the memory cell array 11 is described with reference to FIG. 4 and FIG. 5. FIG. 4 is a perspective view illustrating a structure of a part of the memory cell array 11. FIG. 5 is an equivalent circuit diagram of one NAND cell unit NU.

As illustrated in FIG. 4, the memory cell array 11 has a structure in which interlayer insulating layers 21 and conductive layers 22 are alternately stacked one by one on a semiconductor substrate SB. The conductive layers 22 function as control gates (word lines WL) for the memory cells MC, the source-side select gate line SGS, and the drain-side select gate line SGD. The interlayer insulating layers 21 are located above and below each of the conductive layers 22 and insulate the conductive layers 22 from each other.

The conductive layer 22 may be formed from, for example, tungsten (W), tungsten nitride (WN), tungsten silicide (WSix), tantalum (Ta), tantalum nitride (TaN), tantalum silicide (TaSix), palladium silicide (PdSix), erbium silicide (ErSix), yttrium silicide (YSix), platinum silicide (PtSix), hafnium silicide (HfSix), nickel silicide (NiSix), cobalt silicide (CoSix), titanium silicide (TiSix), vanadium silicide (VSix), chromium silicide (CrSix), manganese silicide (MnSix), iron silicide (FeSix), ruthenium (Ru), molybdenum (Mo), titanium (Ti), titanium nitride (TiN), vanadium (V), chromium (Cr), manganese (Mn), iron (Fe), cobalt (Co), nickel (Ni), gold (Au), silver (Ag), or copper (Cu) or a compound made from any combination thereof, or may be formed from a doped polysilicon.

Each semiconductor layer 23 has a longitudinal direction thereof set parallel to the stacking direction (a Z-direction illustrated in FIG. 4) in such a way as to penetrate through a stacked body composed of the interlayer insulating layers 21 and the conductive layers 22. The semiconductor layers 23 are arrayed at a predetermined pitch within an X-Y plane. A memory layer 24 is provided between the outer periphery of the semiconductor layer 23 and the stacked body that is composed of the interlayer insulating layers 21 and the conductive layers 22. The memory layer 24 includes a ferroelectric material. The memory cell MC stores data according to an orientation of the direction of polarization of the memory layer 24 (which here is a direction perpendicular to the thin-film surface). That is, a data value is assigned to a particular direction of polarization and a stored data value can be changed in each memory cell MC when the direction of polarization in the memory cell MC is change/reversed by a writing or erasing operation as the case may be.

The semiconductor layer 23 functions as a channel region for the memory cell MC, dummy cells DMC1 and DMC2, and the select transistors S1 and S2, which are provided in the NAND cell unit NU. The semiconductor layers 23 extend as pillars, columns, cylinders or the like and are connected to respective bit lines BL via contacts Cb at the respective upper ends of the semiconductor layers 23. The bit lines BL are arranged with a longitudinal direction thereof set parallel to the Y-direction and are arrayed at a predetermined pitch in the X-direction.

The lower end of the semiconductor layer 23 is electrically connected to the semiconductor substrate SB. The lower end of the semiconductor layer 23 is electrically connected to the source line SL via the semiconductor substrate SB and a source contact LI. The source line SL is arranged with a longitudinal direction thereof set parallel to the Y-direction as with the bit line BL.

The stacked body composed of the interlayer insulating layers 21 and the conductive layers 22 of the memory cell array 11 is divided into blocks. These blocks are the minimum unit of data erasing. A trench Tb is formed at a boundary between each block. An insulating material is embedded in the trench Tb. A source contact LI penetrates through the insulating material embedded in the trench Tb. The lower end of the source contact LI is connected to the semiconductor substrate SB and, the upper end of the source contact LI is connected to the source line SL.

FIG. 5 is an equivalent circuit diagram of one NAND cell unit NU in the memory cell array 11. The NAND cell unit NU includes memory strings MS, drain-side select transistors S11 and S12, and source-side select transistors S21 and S22. The depicted NAND cell unit NU includes two memory strings MS and thus includes memory cells MC11, MC21, MC31, MC41, MC51, MC61, MC12, MC22, MC32, MC42, MC52, and MC62.

The drain-side select transistors S11 and S12 are respectively provided between the upper ends of the memory strings MS and the corresponding bit lines BL1 and BL2. The source-side select transistors S21 and S22 are similarly provided between the lower ends of the memory strings MS and the source line SL.

The memory cells MC11, MC21, MC31, MC41, MC51, and MC61 are provided in series between the drain-side select transistor S11 and the source-side select transistor S21. The memory cells MC12, MC22, MC32, MC42, MC52, and MC62 are provided in series between the drain-side select transistor S12 and the source-side select transistor S22.

The memory cells MC11 and MC12 are provided in association with a word line WL1. The memory cells MC21 and MC22 are provided in association with a word line WL2. The memory cells MC31 and MC32 are provided in association with a word line WL3. The memory cells MC41 and MC42 are provided in association with a word line WL4. The memory cells MC51 and MC52 are provided in association with a word line WL5. The memory cells MC61 and MC62 are provided in association with a word line WL6.

Figure 6:
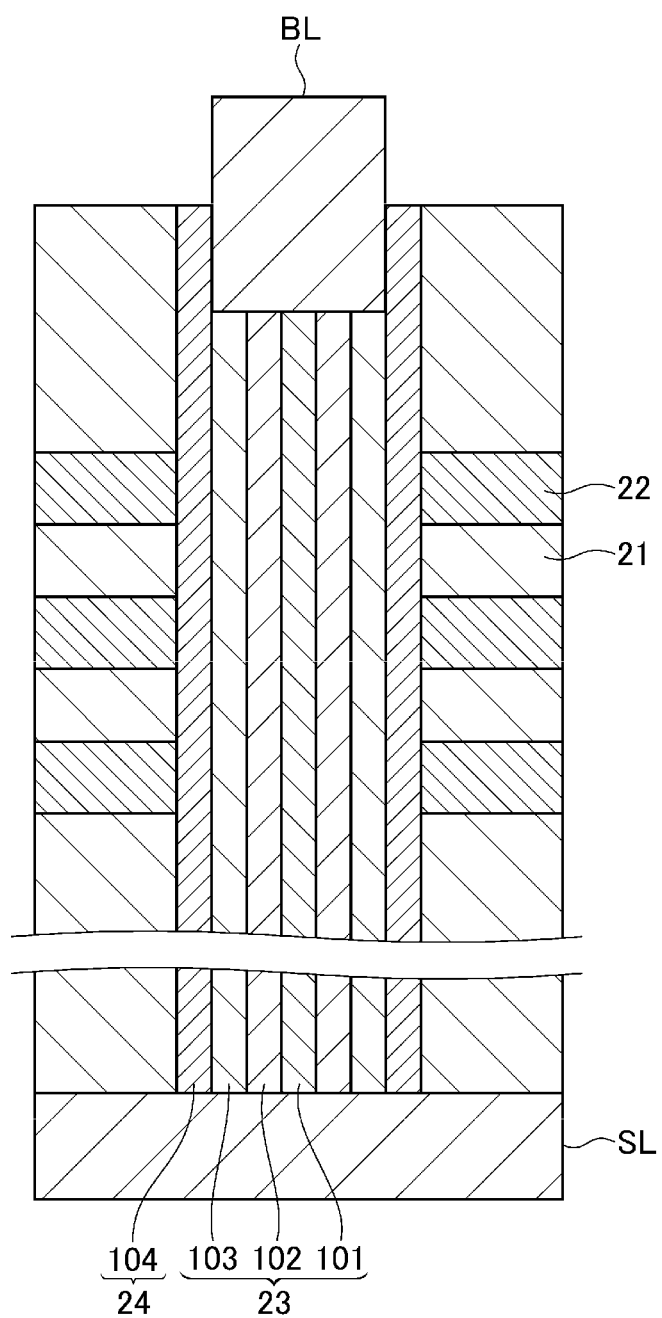
FIG. 6 is a cross-sectional view illustrating a part of a memory cell array.

FIG. 6 is a cross-sectional view illustrating a part of the memory cell array 11. The semiconductor layer 23 comprises an oxide film core 101, a hole transfer layer 102, and an n-type oxide semiconductor layer 103. The memory layer 24 comprises a ferroelectric layer 104.

The oxide film core 101 is formed in a columnar shape. The oxide film core 101 comprises, for example, silicon oxide ($SiO_2$). In other examples, the material of the oxide film core 101 be another insulating film material other than an oxide such as a nitride.

The hole transfer layer 102 is formed around the oxide film core 101. The hole transfer layer 102 is electrically connected to the bit line BL and the source line SL. The hole transfer layer 102 comprises at least one of a Group IV semiconductor material or a p-type oxide semiconductor material. The Group IV semiconductor material to be used may be a semiconductor material containing at least one Group IV element such as silicon (Si), germanium (Ge), or tin (Sn). The Group IV semiconductor material may be in amorphous form, polycrystalline form, or single-crystal form. The Group IV semiconductor material may initially be a p-type semiconductor material or an undoped semiconductor material. A p-type oxide semiconductor material can be, for example, a copper oxide (for example, $Cu_2O$), a tin oxide (for example, SnO), and a nickel oxide (for example, NiO). In the present example, the hole transfer layer 102 comprises an amorphous silicon film, but in other examples the hole transfer layer 102 may be a polycrystalline silicon film or a single-crystal silicon film.

The n-type oxide semiconductor layer 103 is formed surrounding the hole transfer layer 102. The n-type oxide semiconductor layer 103 may comprise an oxide including at least one of indium (In), gallium (Ga), aluminum (Al), zinc (Zn), and titanium (Ti). For example, the n-type oxide semiconductor layer 103 can be IGZO IAZO, or titanium oxide (for example, $TiO_2$). The thickness of the n-type oxide semiconductor layer 103 is 5 nm or more and 20 nm or less, and may be set to about 10 nm.

The ferroelectric layer 104 is formed surrounding the n-type oxide semiconductor layer 103. In the present embodiment, changing the polarity of the ferroelectric layer 104 is used to perform a write or erasing operation. The ferroelectric layer 104 may include, as a ferroelectric material, an oxide which contains hafnium (Hf) or the like. For example, the ferroelectric layer 104 may include, for example, a hafnium oxide in orthorhombic crystal form. The hafnium oxide included in a ferroelectric film may be the one composed mainly of orthorhombic crystals. More specifically, the hafnium oxide included as a ferroelectric material may be the one composed mainly of a third orthorhombic crystal (orthorhombic III, space group $Pbc2_1$, space group number 29). The crystals in orthorhombic crystal form may be predominate among the crystals of hafnium oxide included in the ferroelectric film. An orthorhombic crystal is also called a "rhombic crystal". The ferroelectric layer 104 containing hafnium (Hf) may further contain at least one of zirconium (Zr), aluminum (Al), or silicon (Si). For example, the ferroelectric layer 104 containing hafnium (Hf) may comprise hafnium zirconium oxide (HfZrO), hafnium aluminum oxide (HfAlO), or hafnium silicon oxide (HfSiO).

The interlayer insulating layers 21 and the conductive layers 22 are provided surrounding the ferroelectric layers 104. The interlayer insulating layers 21 and the conductive layers 22 are alternately stacked on each other. The conductive layers 22 can individually function as a gate electrode of the memory cell MC.

As described above, in the semiconductor memory device according to the present embodiment, the semiconductor layer 23 and the memory layer 24 extend in a direction intersecting with the surface of the substrate SB and connect, via a contact metal or the like, to the substrate SB. The semiconductor layer 23 and the memory layer 24 are also connected to the source line SL via the contact metal. The semiconductor layer 23 is connected to the bit line BL on an end opposite to the source line SL.

Figure 7:
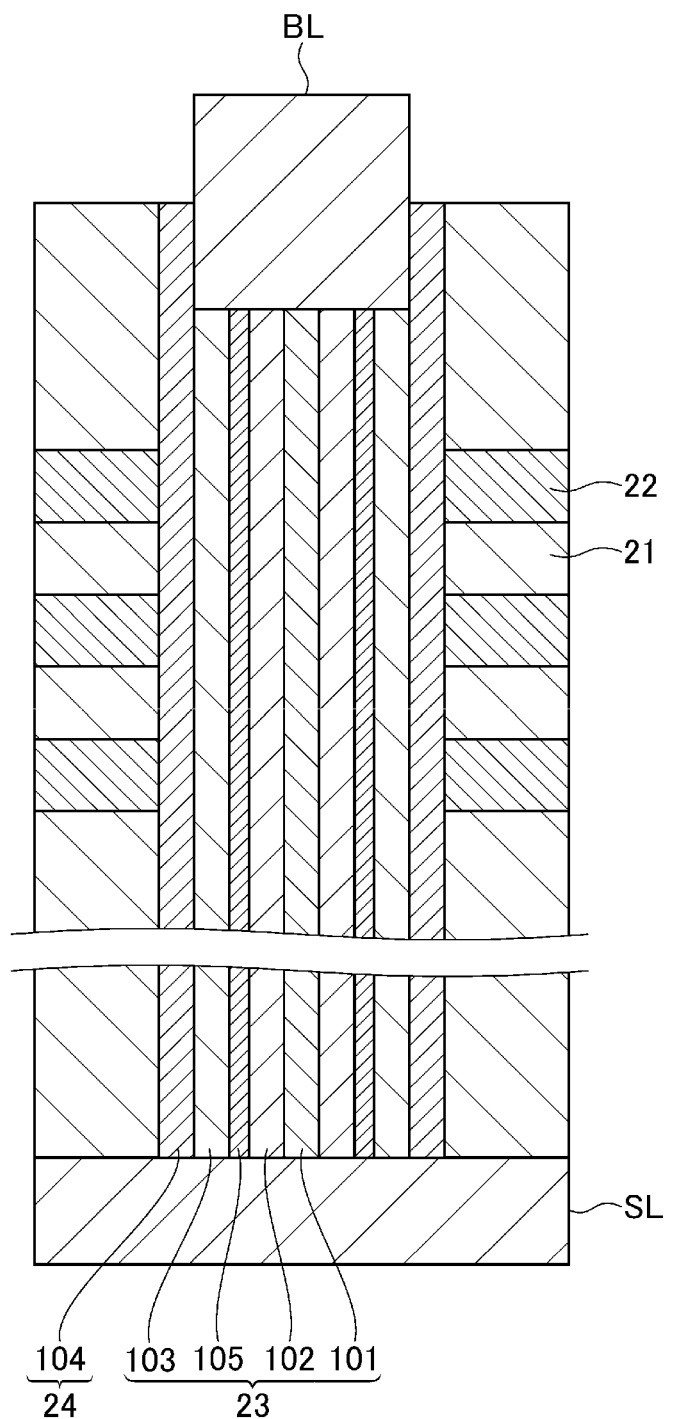
FIG. 7 is a cross-sectional view illustrating an interfacial layer or an electronic barrier layer additionally provided in a memory cell array.

FIG. 7 is a cross-sectional view illustrating a structural example in which an intermediate layer is additionally provided in the memory cell array 11 illustrated in FIG. 6. An intermediate layer 105 is provided as an interfacial layer between the hole transfer layer 102 and the n-type oxide semiconductor layer 103. The intermediate layer 105 includes a material with a larger band gap than that of the n-type oxide semiconductor layer 103. The intermediate layer 105 includes, for example, a silicon oxide (for example, $SiO_2$) or an InGaSiO (IGSO). The intermediate layer 105 acts as a hole barrier layer and is thus able to promote a hole retention force of the hole transfer layer 102 and retain an electrical potential used for changing the polarized state of the ferroelectric layer 104. The intermediate layer 105 acts as an electronic barrier layer and is thus able to prevent or reduce any leakage occurring between the hole transfer layer 102 and the n-type oxide semiconductor layer 103 during a read.

Examples of operations (more particularly a write operation, an erasing operation, and a read operation) of the semiconductor memory device in the second embodiment are described. In the following description, a case where a memory cell MC21 is selected as one of a plurality of memory cells MC on which to perform write and read operations is described.

Figure 8:
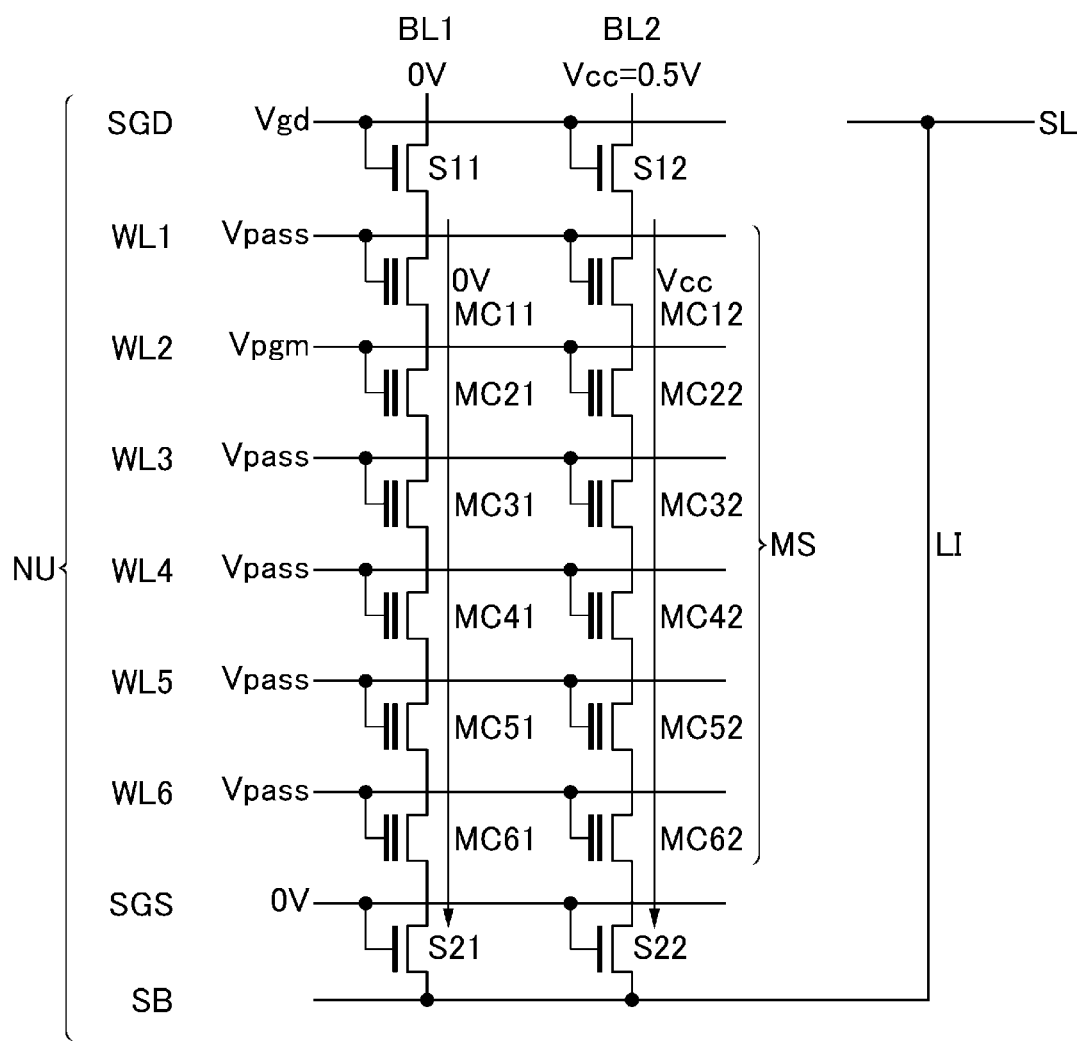
FIG. 8 is an equivalent circuit diagram illustrating an operation which occurs in performing a write to a memory cell.

A write operation is described with reference to FIG. 8 and FIG. 9. As illustrated in FIG. 8, in a write operation a write voltage (Vpgm=3 volts (V)) is applied to a word line WL2 corresponding to the selected memory cell MC21. A voltage of 0 V is applied to a bit line BL1, which is the bit line corresponding to the currently selected memory cell MC21. A write pass voltage (Vpass=2 V) is applied word lines WL1, WL3, WL4, WL5, and WL6, which are not currently selected. A voltage Vcc (for example, 0.5 V) is applied to bit line BL2, which is not a currently selected bit line.

Since a write voltage of 3 V is applied to the memory cell MC21 by this operation, the polarized state of the ferroelectric layer 104 in the memory cell MC21 changes, so that positive electric charge is induced on a surface of the ferroelectric layer 104 facing the n-type oxide semiconductor layer 103 and write is thus performed. Since a voltage lower than the voltage for polarization inversion is applied to the other memory cells MC11, MC31 to MC61, and MC12 to MC62, which are not currently selected, write is not performed on these non-selected memory cells MC.

Furthermore, a voltage Vcc is applied to the drain-side select gate line SGD and to the bit line BL2 to bring the drain-side select transistor S12 into an OFF state and thus place the memory cells MC12 to MC62 into a floating state. In this case, since the voltage for polarization inversion is not applied to the memory cells MC12 to MC62, write is not performed on these cells.

Figure 9:
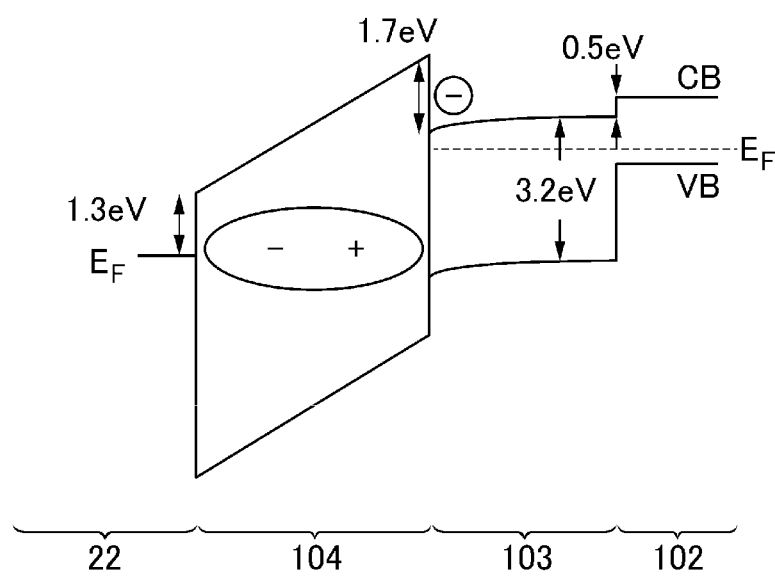
FIG. 9 is an energy band diagram illustrating energy bands relevant to performing a write operation.

FIG. 9 is an energy band (band gap) diagram illustrating a relationship between energy bands of various regions in the semiconductor memory device according to the present embodiment and particularly illustrating a state occurring at the time of writing to the memory cell MC21.

Specifically, FIG. 9 illustrates, in order from the left side thereof, the Fermi level $E_F$ of the conductive layer 22 (for example, made from tungsten) functioning as a control gate (also referred to as a gate electrode), an energy band of the ferroelectric layer 104, a valence band VB and a conduction band CB of the n-type oxide semiconductor layer 103, and a valence band VB and a conduction band CB of the hole transfer layer 102. As illustrated in FIG. 9, when a write voltage is applied, the polarized state of the ferroelectric layer 104 changes, so that positive electric charge is induced on a surface of the ferroelectric layer 104 facing the n-type oxide semiconductor layer 103.

Figure 10:
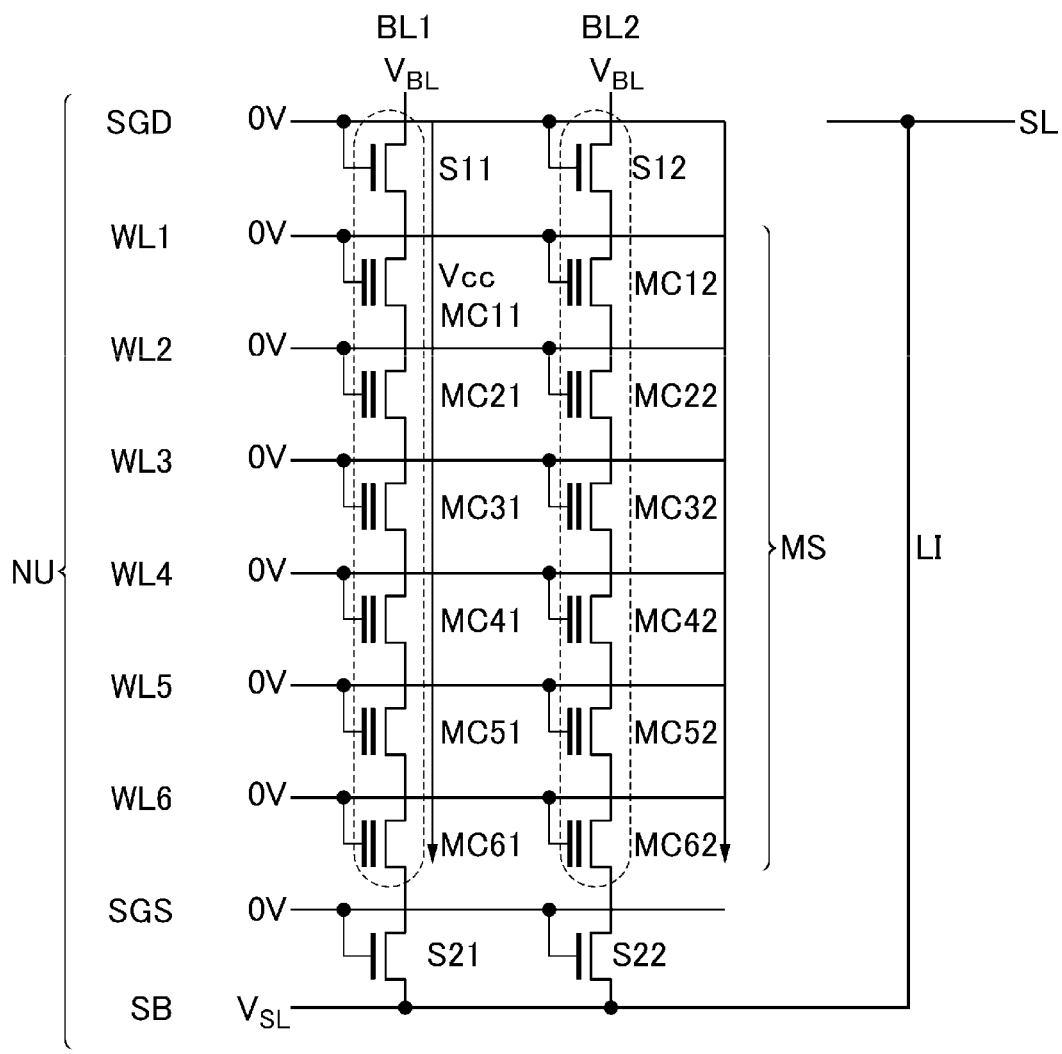
FIG. 10 is an equivalent circuit diagram illustrating an operation which occurs in performing an erasing on a previously written memory cell.

An erasing operation is described with reference to FIG. 10 and FIG. 11. The erasing operation can be simultaneously performed on an entire page (all memory cells MC connected to the same word line WL) to which the selected memory cell MC21 belongs. As illustrated in FIG. 10, at the time of erasing, the electrical potentials of all of the word lines WL1 to WL6 are set to 0 V. The erasing operation may be performed on the entire block to which the memory cell MC21 belongs or may be performed on only the memory cell MC21.

To perform polarization inversion, the voltage to be applied to the ferroelectric layer 104 is also set in consideration of the film thickness of the ferroelectric layer 104. As one example, assuming that the relative permittivity and film thickness of the ferroelectric layer 104 are 30 and 10 nm, respectively, and the relative permittivity and film thickness of the n-type oxide semiconductor layer 103 are 16 and 8 nm, respectively, when the bit line voltage VBL for the bit lines BL1 and BL2 becomes 8.6 V (which is the value of VCC in this context), a voltage of 3 V is applied to the ferroelectric layer 104. If the film thickness or other characteristics of the ferroelectric layer 104 or the n-type oxide semiconductor layer 103 are different from those of this example, then voltage sharing changes.

Figure 11:
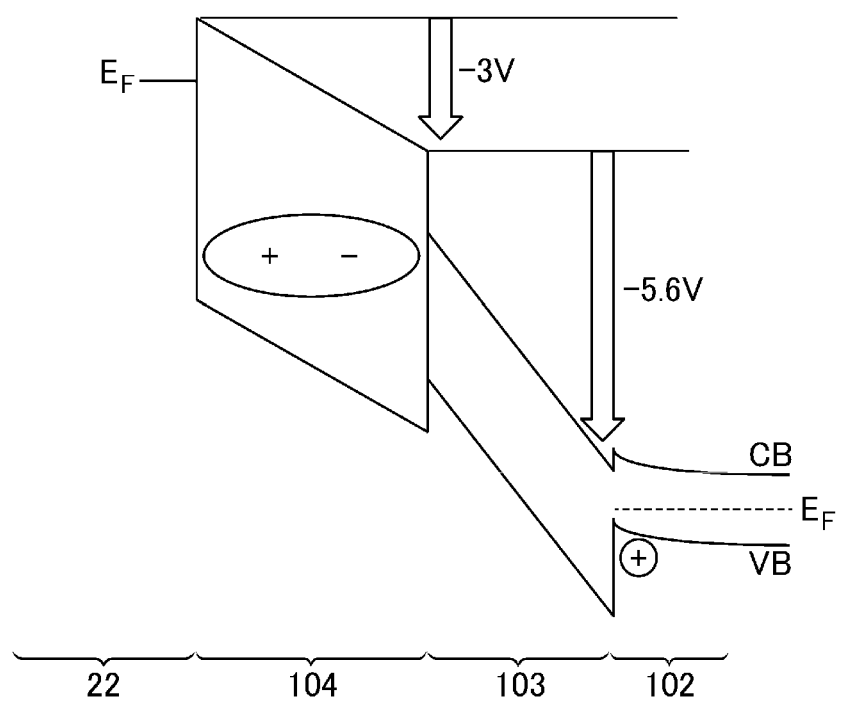
FIG. 11 is an energy band diagram illustrating energy bands relevant to performing an erasing operation.

FIG. 11 is an energy band diagram illustrating a relationship between energy bands of various regions in the semiconductor memory device according to the present embodiment and particularly illustrating a state occurring at the time of erasing in the memory cell MC21.

FIG. 11, as with FIG. 9, illustrates, in order from the left side thereof, the Fermi level $E_F$ of the conductive layer 22 functioning as a control gate, an energy band of the ferroelectric layer 104, a valence band VB and a conduction band CB of the n-type oxide semiconductor layer 103, and a valence band VB and a conduction band CB of the hole transfer layer 102. As illustrated in FIG. 11, a voltage of 3 V is applied to the ferroelectric layer 104 inversely as compared with FIG. 9, and holes caused by gate induced drain leakage (GIDL) current flowing through the hole transfer layer 102 are maintained within the hole transfer layer 102, so that an electrical potential occurring in the ferroelectric layer 104 is maintained. Accordingly, negative electric charge is induced on a surface of the ferroelectric layer 104 facing the n-type oxide semiconductor layer 103, so that a channel of the n-type oxide semiconductor layer 103 disappears.

Figure 12:
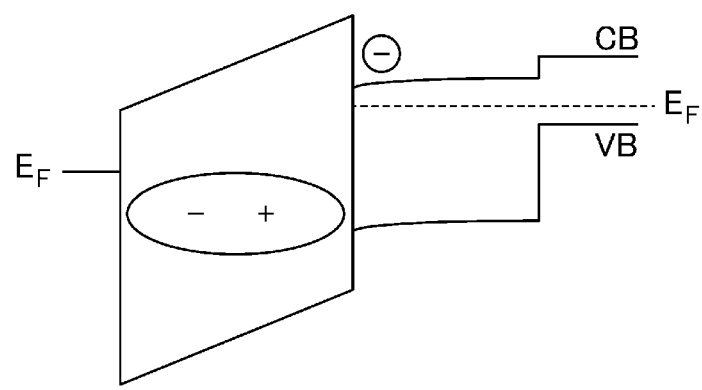
FIG. 12 is an energy band diagram illustrating energy bands relevant to performing a read operation on a previously written memory cell.

FIG. 12 is a diagram illustrating energy bands for a read operation on a memory cell after performing a write on the memory cell. At the time of reading, the electrical potential of the selected word line WL2 corresponding to the memory cell MC21 targeted for read is set to 0 V and a voltage Vread is applied to the unselected word lines WL1 and WL3 to WL6. Then, the operation reads out the present write state of the selected memory cell MC21 based on whether a current flows through the selected bit line BL1. As illustrated in FIG. 12, in the memory cell MC21, since energy bands change due to the polarization of the ferroelectric layer 104 and positive electric charge is induced on a surface of the ferroelectric layer 104 facing the n-type oxide semiconductor layer 103, the n-type oxide semiconductor layer 103 functions as a channel and a current flows therethrough.

Figure 13:
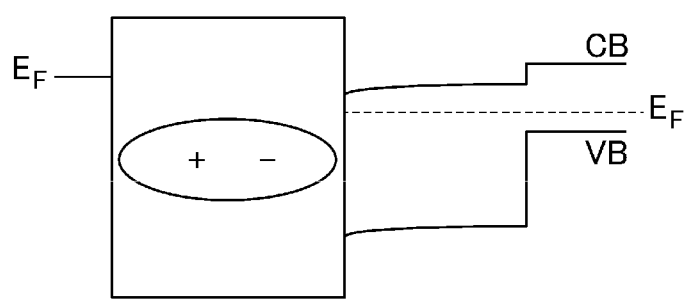
FIG. 13 is an energy band diagram illustrating energy bands which occur in performing a read operation after an erasing.

FIG. 13 is a diagram illustrating energy bands for a read operation on a memory cell after performing an erasing on the memory cell. At the time of reading, the electrical potential of the selected word line WL2 corresponding to the memory cell MC21 targeted for reading is set to 0 V and a voltage Vread is applied to the unselected word lines WL1 and WL3 to WL6. Then, the operation reads out the present write state (written or erased state value) of the selected memory cell MC21 based on whether a current flows through the selected bit line BL1. As illustrated in FIG. 13, in the memory cell MC21, since negative electric charge is induced on a surface of the ferroelectric layer 104 facing the n-type oxide semiconductor layer 103, the n-type oxide semiconductor layer 103 does not function as a channel and no current flows therethrough.

Since the hole transfer layer 102 is currently in a floating state or no electric charge occurs at the interface between the n-type oxide semiconductor layer 103 and the hole transfer layer 102 because the hole transfer layer 102 has a higher conduction band CB than the n-type oxide semiconductor layer 103, leakage in the hole transfer layer 102 during a read operation is unlikely to occur. If leakage in the hole transfer layer 102 is a concern, as described above with reference to FIG. 7, a configuration in which an electronic barrier layer is provided as the intermediate layer 105 so that a layer including a material with a larger band gap Eg than that of the n-type oxide semiconductor layer 103, such as a silicon oxide or an IGSO, is formed can be employed.

As described above, since the write operation and the read operation relies on the n-type oxide semiconductor layer 103 and the erasing operation relies on the hole transfer layer 102, the mobility in the hole transfer layer 102 needs only to be sufficient so as to not excessively limit the erasing speed for the ferroelectric layer 104 and, in general, the required mobility for such may be relatively low.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device, comprising:
a ferroelectric layer;
a first semiconductor layer electrically connected to a first electrode and a second electrode and including an n-type oxide semiconductor material;
a third electrode opposite the first semiconductor layer, the ferroelectric layer being between the third electrode and the first semiconductor layer;
a second semiconductor layer including at least one of a Group IV semiconductor material or a p-type oxide semiconductor material, the first semiconductor layer being between the ferroelectric layer and the second semiconductor layer; and
an intermediate layer between the first semiconductor layer and the second semiconductor layer.

2. The semiconductor memory device according to claim 1, wherein the intermediate layer comprises an oxide with a chemical composition different from that of each of the first semiconductor layer and the second semiconductor layer.

3. The semiconductor memory device according to claim 1, wherein the intermediate layer is silicon oxide.

4. The semiconductor memory device according to claim 1, wherein the intermediate layer is an oxide containing indium, gallium, and silicon.

5. The semiconductor memory device according to claim 1, wherein the n-type oxide semiconductor material is an oxide of at least one of indium, gallium, aluminum, zinc, or titanium.

6. The semiconductor memory device according to claim 1, wherein the ferroelectric layer is an oxide comprising hafnium.

7. The semiconductor memory device according to claim 6, wherein the oxide comprising hafnium (Hf) further comprises at least one of zirconium, aluminum, or silicon.

8. The semiconductor memory device according to claim 1, wherein the second semiconductor layer is electrically connected to the first electrode and the second electrode.

9. The semiconductor memory device according to claim 1, further comprising:
a plurality of conductive layers stacked one on the other, the stacked conductive layers being spaced from each other in the direction of stacking, wherein
the ferroelectric layer extends along the side surfaces of the plurality of conductive layers.

10. A semiconductor memory device, comprising:
a first oxide layer comprising hafnium;
a first semiconductor layer electrically connected to a first electrode and a second electrode and comprising an oxide semiconductor material comprising at least one of indium, gallium, aluminum, zinc, or titanium;
a third electrode opposite the first semiconductor layer, the first oxide layer being between the third electrode and the first semiconductor layer;
a second semiconductor layer including at least one of a Group IV semiconductor material or a p-type oxide material, the first semiconductor layer being between the first oxide layer and the second semiconductor layer; and
a second oxide layer between the first semiconductor layer and the second semiconductor layer and comprising an element in the Group IV semiconductor material.

11. The semiconductor memory device according to claim 10, wherein the second oxide layer has a composition different from each of the first and second semiconductor layers.

12. The semiconductor memory device according to claim 10, wherein the second oxide layer is silicon oxide.

13. A semiconductor memory device, comprising:
a first oxide layer comprising hafnium;
a first semiconductor layer electrically connected to a first electrode and a second electrode and comprising an oxide semiconductor material comprising at least one of indium, gallium, aluminum, zinc, or titanium;
a third electrode opposite the first semiconductor layer, the first oxide layer being between the third electrode and the first semiconductor layer;
a second semiconductor layer including at least one of a Group IV semiconductor material or a p-type oxide material, the first semiconductor layer being between the first oxide layer and the second semiconductor layer; and
a second oxide layer between the first semiconductor layer and the second semiconductor layer, the second oxide layer comprising indium, gallium, and silicon.

14. The semiconductor memory device according to claim 10, wherein the first semiconductor layer is a n-type oxide semiconductor.

15. The semiconductor memory device according to claim 10, wherein the first oxide layer further comprises at least one of zirconium, aluminum, or silicon.

16. The semiconductor memory device according to claim 10, further comprising:
an insulating core having a cylindrical shape, wherein
the first oxide layer, the first semiconductor layer, and the second semiconductor layer are on the insulating core, and
the second semiconductor layer is between the first semiconductor layer and the insulating core.

17. The semiconductor memory device according to claim 13, wherein the first semiconductor layer is a n-type oxide semiconductor.

18. The semiconductor memory device according to claim 13, wherein the first oxide layer further comprises at least one of zirconium, aluminum, or silicon.

19. The semiconductor memory device according to claim 13, further comprising:
an insulating core having a cylindrical shape, wherein
the first oxide layer, the first semiconductor layer, and the second semiconductor layer are on the insulating core, and
the second semiconductor layer is between the first semiconductor layer and the insulating core.

* * * * *